(12) United States Patent
Gustat

(10) Patent No.: US 6,369,611 B1
(45) Date of Patent: Apr. 9, 2002

(54) SEQUENTIAL CIRCUIT FOR HIGH FREQUENCY CLOCKING

(76) Inventor: Hans Gustat, Ziestsee 4, D-15752, Prieros (DE)

( * ) Notice: Subject to any disclaimer, the term of this patent is extended or adjusted under 35 U.S.C. 154(b) by 0 days.

(21) Appl. No.: 09/443,917

(22) Filed: Nov. 19, 1999

(30) Foreign Application Priority Data

Nov. 23, 1998 (DE) .......................................... 198 54 994

(51) Int. Cl.⁷ .................................................. G06F 7/38
(52) U.S. Cl. .......................................... 326/46; 326/93
(58) Field of Search .............................. 326/40, 46, 93

(56) References Cited

U.S. PATENT DOCUMENTS 4,275,316 A * 6/1981 Knapp ........................ 307/279
6,157,210 A * 12/2000 Zaveri et al. ................. 326/40

* cited by examiner

Primary Examiner—Michael Tokar
Assistant Examiner—Ahn Q. Tran
(74) Attorney, Agent, or Firm—Karl Hormann

(57) ABSTRACT

Circuit arrangement, and a method of its operation, for substantially reducing the running times in clocked logic circuits by eliminating conventional storage registers and by controlling the signal flow by parallel connection to the output of a gate or other signal transmitting circuit component of an additional current source which may be changed by the clock pulse.

7 Claims, 4 Drawing Sheets

US 6,369,611 B1

SEQUENTIAL CIRCUIT FOR HIGH FREQUENCY CLOCKING

BACKGROUND OF THE INVENTION

1. Field of the Invention

The invention, in general, relates to switching arrangements for logic circuits clocked at a very high frequency and to methods of clocking these logic circuits. More particularly, the invention relates to sequential circuits for integrated circuits which operate at very high clock frequencies.

2. The Prior Art

A known principle of structuring clocked logic circuits or sequential circuits of the kind depicted in FIG. 1 consists of connecting the data outputs of storage units or registers which are synchronously controlled by a clock, to the inputs of blocks of gates (a term which in the present context is intended also to include inverters) and of connecting, in turn, the outputs of the logic circuits to the input of registers, and so forth. Finite state machines as well as synchronously clocked data flow machines often make use of this principle. In such an arrangement, a subsequent register may be wholly or partially identical to the preceding one, so that cyclic feedbacks are generated.

The shorter the maximum time delay of a pass from a register through the signal path of the logic block to another register, the higher may be the selected clock rate and, hence, the processing power of such a clocked circuit. The maximum time delay of a clock cycle consists of the maximum duration of the signal passage through the block in the least favorable case (on the critical path) as well as the maximum time delays and, optionally, the necessary lead times of the registers utilized.

In circuits of this kind, the registers are necessary for interrupting the signal flow until all output signals of the logic circuit, which may obviously be subject to different time delays in the various paths, are valid and which at this instant store the signal for further transmission.

In simple logic functions of short signal passages through a given path of the block the maximum time delay for a clock cycle is essentially defined by the time delays of the registers. For that reason, a number of circuits seeking to reduce the time delay of registers have been developed (for instance U.S. Pat. No. 4,057,741).

OBJECTS OF THE INVENTION

It is, therefore, an object of the present invention to provide clocked circuits of very low time delays or very high data throughput.

It is a further object to provide logic circuits clocked at a high frequency and which require no registers for clocking the signal passage.

SUMMARY OF THE INVENTION

In accordance with a currently preferred embodiment this clocking is achieved by connecting at the output of a gate of the logic circuit an additional current source, hereinafter sometimes referred to as "clocked current source", in parallel to the output of the corresponding gate. The output current of the additional current source is controlled by the frequency of a clock. The gate has one output and, in a generalized case, N inputs.

BRIEF DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

DETAILED DESCRIPTION OF THE PREFERRED EMBODIMENTS

Figure 2:
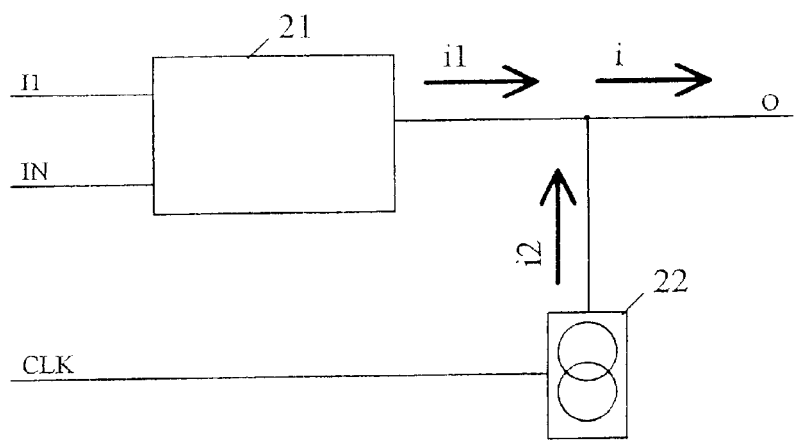
FIG. 2 is a block diagram depicting a circuit arrangement in accordance with the invention.

The load capacity present at the output junction (A) has not been shown in FIG. 2; but its effect will be taken into consideration in the following description. Voltage changes at the output junction (A) require charge or discharge currents of the load capacity present at A. This is achieved by the temporally variable output current which is the sum of the instantaneous output current i2 of the current source 22 and of the instantaneous output current i1 of the gate 21. In other words, the gate itself will hereafter also be considered as a variable current source rather than as a variable current source with a load-depending delay, of the kind often used in digital circuit technology.

Figure 3:
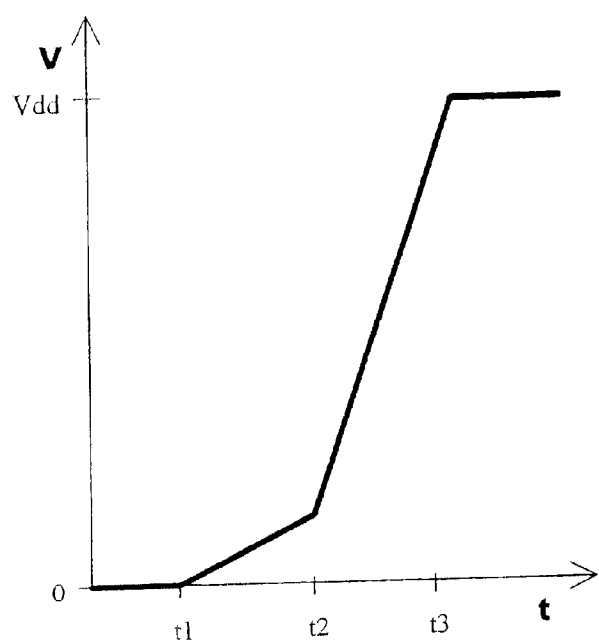
FIG. 3 is a graph depicting the time characteristic of the output voltage of a circuit in accordance with the invention.

FIG. 3 schematically depicts an example of the time characteristic of the output voltage (voltage axis: V, time axis: t) of such a gate clocked by an additional current source.

For simplifying the description let it be assumed that when switching the output of the gate towards a positive operating voltage, the output current i1 of the output stage of the gate will be at a constant value I1 (i1=I1) as long as the output voltage has not fully reached the value of the positive operating voltage (Vdd in FIG. 3). When this condition has been reached, the output current may be assumed to be zero (i1=0).

The same assumption will be made as to switching the output of the clocked current source towards the positive operating voltage: Until the positive operating voltage has been reached, the output current i2 of the clocked current source 22 is assumed to be of constant value I2 (i2=I2); thereafter its value is assumed to be zero (i2=0).

Inversely, when switching from, or discharging, the negative operating voltage (0 in FIG. 3), it is to be assumed that what has been said supra holds true as well, albeit with negative signs (i1=−I1, i2=−I2), for the two outputs, since it is a discharge of the load capacity at A. In this case too, the output currents are each assumed to be zero (i1=0, i2=0) again, when the negative operating voltage has been reached. Furthermore, it is to be assumed that the constant value 11 is higher than the constant value I2, for instance twice as high (I1=2×I2).

FIG. 3 depicts the condition of the output stage of the gate commencing its switching earlier than the clocked current source. In this case let it be assumed that both current sources are initially switched to discharge. Initially, no current is flowing as the output voltage has already reached the value of the negative operating voltage.

In FIG. 3, instant t1 denotes the instant at which the output stage of the gate switches so that its output current is i1=I1. This causes a small shift of the output voltage away from zero, so that current is immediately contributed from i2 as well. However, initially the clocked current source remains switched to discharge so that its current is negatively biased (i2=−I2). The resulting output current is the sum of both currents; that is to say, because of the opposite bias it is the difference of the values (i1+i2=I1−I2). For that reason, the output voltage at this time increases only slowly: Compared to switching only by the unclocked current i1 of the output stage of the gate, its increase amounts to the fraction (I1−I2/I1) only of the original increase. In the mathematical example (I1=2×I2), this fraction would be 50%, so that in this phase the change in output current and, hence, the transmission of the signal would be slowed to half the original velocity.

In FIG. 3, the instant t2 denotes the instant at which the clocked current source switches so that its output current is i2=I2. The resulting output current again is the sum of the two currents; because of the same bias it is, therefore, the sum of the values (i1+i2=I1+I2). Hence, the output voltage now increases significantly more quickly: compared to switching by means of the current I1 of the output stage of the gate only, its increase now amounts to the factor (I1+I2)/I1 of the original increase. In the mathematical example (I1=2×I2, this factor would be 150% so that in this phase the change in the output voltage and, hence, the transmission of the signal would be accelerated to one and a half times the original velocity. In the case of coincidence the effect of the two current sources would thus be substantially stronger than where they do not act simultaneously (i.e. by the factor (I1+I2)/(I1−I2). In the mathematical example, the factor equals 3.

The positive operating voltage has been reached at instant t3, and both currents decay to zero.

By appropriately dimensioning the current source relative to the output resistance or output current of the gate, the instant at which the switching threshold of the following gate and, hence, the instant in time at which the signal is transmitted to the next gate may be defined, within certain limits, by the input clock sequence. Thus, individual differences in the time delays of the gates may be equalized and these time delays may be conformed to the clock rate.

Not only are delays of the signal possible relative to the through-put time of a gate which is not influenced by the input clock sequence (where the summing currents flow in opposite directions), but also by accelerations (where the currents flow in the same direction).

In this manner, the clock sequence substantially contributes to defining the rate of charge of the output capacity. Substantially phase-locked through-puts of the signal levels relative to the corresponding instants in time at which the control clock sequences switch may in fact be attained by the input switching threshold at the outputs of the clocked gates, thus resulting in clock sequence synchronization without necessitating an interruption in the signal path or in a register.

Compared to a conventional circuit provided with registers, a circuit in accordance with the invention may, on the one hand, operate faster because registers are no longer required and, hence, delays are avoided, and, on the other hand, it is even possible to achieve a further acceleration relative to the minimum through-put time of an unclocked circuit, by the addition of coincident partial currents.

The simplified case of constant current values discussed thus far is no precondition as to the functionality of the logic circuit clocked in accordance with the invention; rather, it is a simplification for purposes of a comprehensible description. In actuality, the output current of the output stage of the gate usually does not only not act as a constant, but also non-linearly as a function of input value and time. On the other hand, clocked current sources may also display a non-linear behavior. In such cases, too, a correct logical function of a gate may be obtained by clocking.

As regards the suitability of a circuit as a clocked current source it is essential, among other things, that its output current may be changed sufficiently quickly with the input clock sequence.

Aside from gates other switching components may also be provided with such a clocked current source. This may, for instance, be a retarding circuit without logical change of the signal.

A complete logic circuit unit includes partial blocks in each of which all clocked current sources are controlled by a clock sequence of equal cycles (or frequency). This may be accomplished by connecting the control inputs of all clocked current sources of a block of the same clock sequence; however, several clock sequences may be used which may be supplied, for instance, at equal frequencies from different driver stages. In this manner, blocks may be provided, for instance, in which each clocked component has a delay defined by the same clock frequency, so that the signal flow displays an easily discernible time pattern.

A circuit unit may contain logic partial blocks in which each of the clocked current sources which are part of one block are controlled by an individual clock sequence the period k×t0 of which is a whole number multiple of a base periodicity t0 of the given block. In this context, k is a whole number. Whereas t0 is constant in the entire block, k may change from one clock sequence input of a clocked current source to another. It is thus possible within a single block to operate at different time delays of the clocked components.

This may be of advantage, for instance, for utilizing, in one block, gates of vastly different complexity the delay time of which would not have to be brought into uniformity by clocking.

In such a cases, the common base periodicity simplifies the design as it allows in a simple manner to form synchronously switching junctions in the signal paths.

Figure 1:
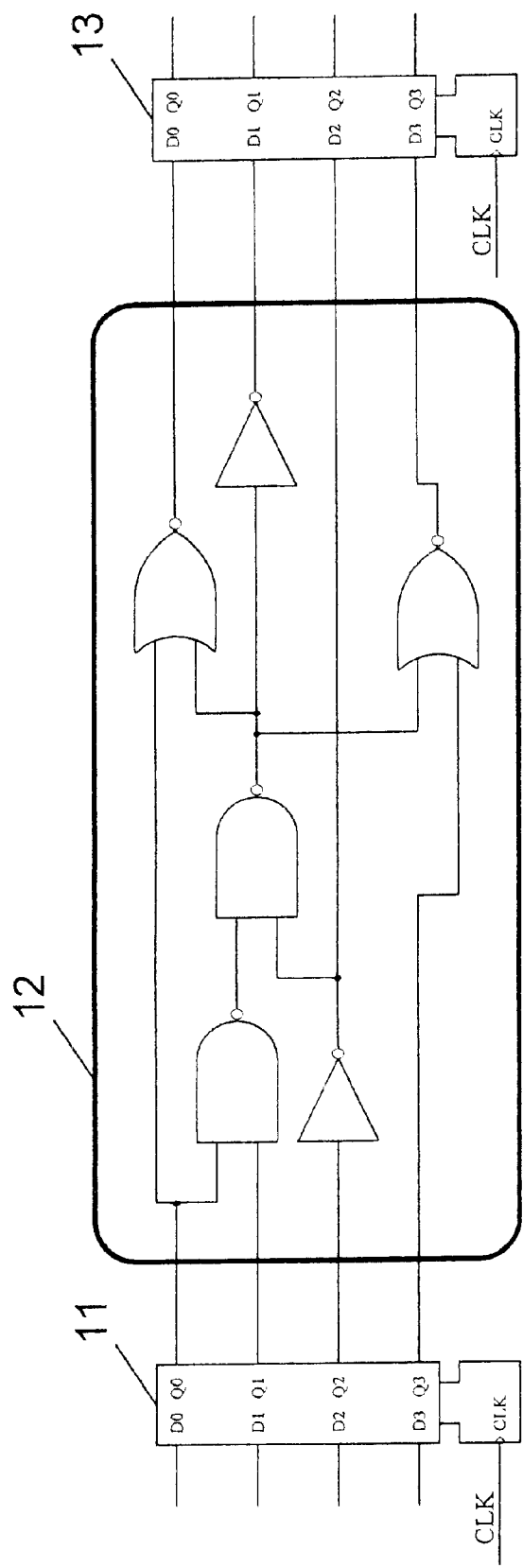
FIG. 1 is a schematic plan view of a prior art clocked logic circuit.

In order to continue applying the design strategy of the structural principle of logic circuits described above which is based upon logic blocks and registers (see FIG. 1) while at the same time avoiding registers by means of the clocking in accordance with the invention and increasing the through-put rate, it is necessary to ensure that—but for a certain admissible residual error—the signal through-puts in each path of the block are of the same time delay.

This is accomplished by structuring the signal paths such that for each signal path through the block the sum of the cycles of the clocked current sources pertaining to the outputs of the components of this path is the same. By appropriately dimensioning the clocked current sources and/or the output stages of the gates it will then be possible to attain a substantially identical total time delay of the paths.

Figure 4:
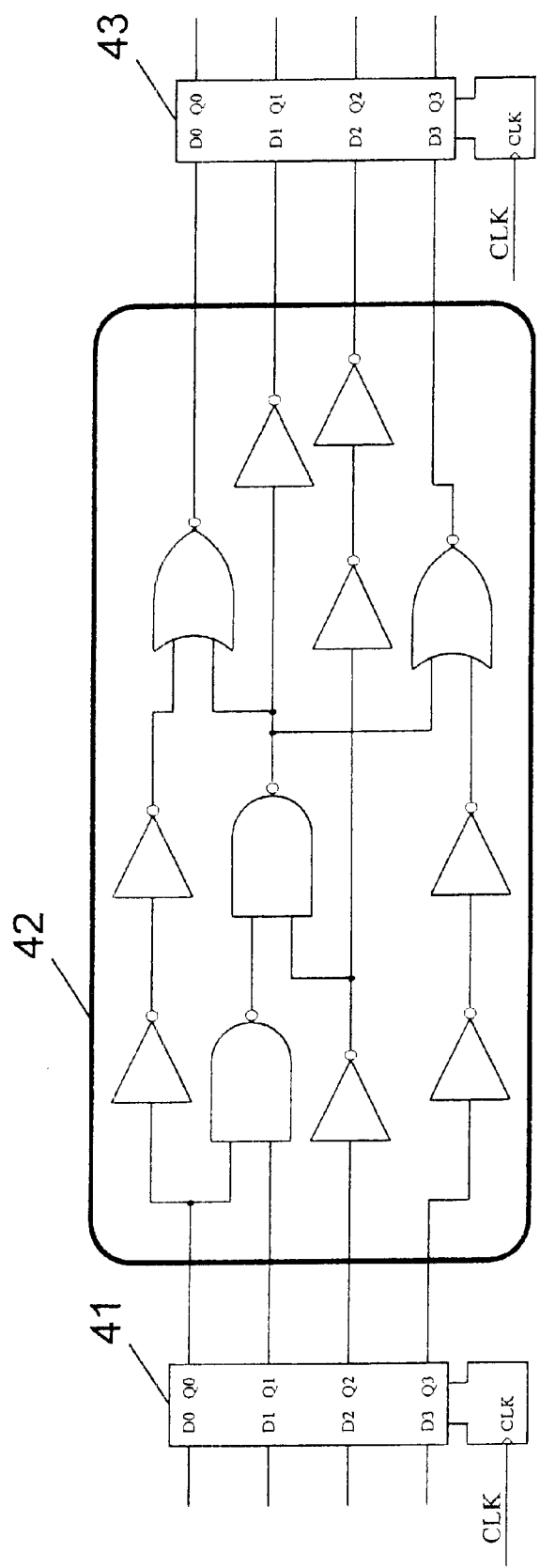
FIG. 4 is a schematic plan view of a first embodiment of a circuit in accordance with the invention.
Figure 5:
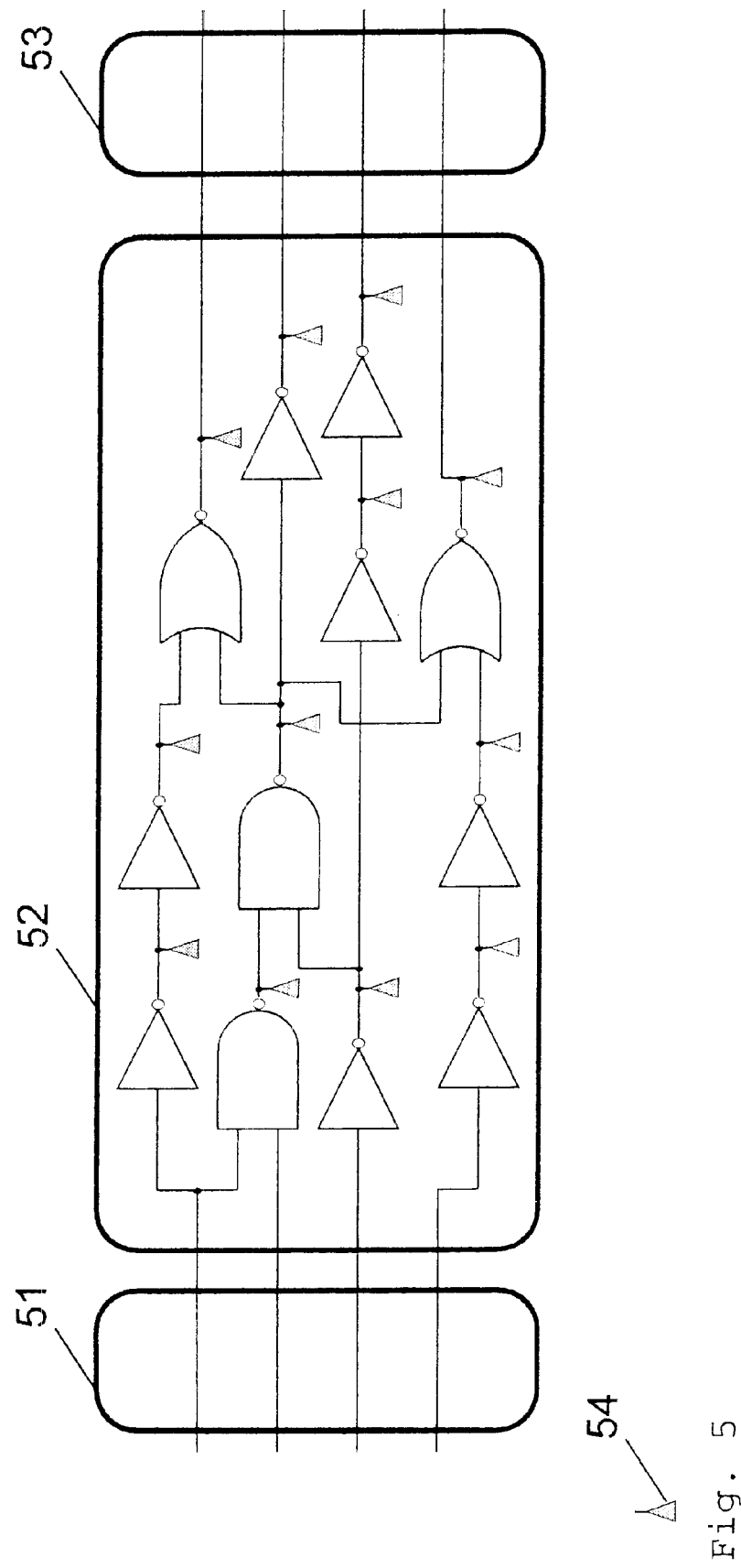
FIG. 5 is a schematic plan view of a second embodiment of a circuit in accordance with the invention.

An example of a basic concept of such a circuit is depicted in FIGS. 4 and 5. It is based upon the exemplary circuit of FIG. 1 albeit changed into a circuit with a substantially similar logic function but with a much higher clocking rate.

In this example, clocking of identical cycles t1 is to be utilized for all clocked gates of the block. Moreover, all gates of the block are to be clocked. For the longest signal paths through the block 12 in FIG. 1 which extend through three gates, clocking would result in a cycle sum of 3×t1.

In order for the cycle sum of all paths to be identical as shown in FIG. 4, additional gates are first inserted in the shorter paths of the block (42) without changing the logic function. By comparison to FIG. 1, two successive inverters have been added to each of three paths in FIG. 4.

Each path now extends through three gates and, given a connection of appropriately dimensioned clocked current sources all of which are controlled by the same cycle duration t1, the sum of the cycle durations for each path is 3×t1. FIG. 5 depicts an example of a circuit including the gates in accordance with FIG. 4 to the output of each of which there is connected a clocked current source. The registers 41 and 43 in FIG. 4 at the exterior connections of the block (52) have been replaced by direct connections (51 and 53). In the design, the direct connections may be considered as "virtual registers".

To simplify the circuit diagram a symbol has been drawn in FIG. 5 for the clocked current source associated with the block 52, i.e. a small vertically disposed isosceles triangle with an upward vertical connection which is to symbolize the output of the current source. In the lower left portion of FIG. 5 symbol has been explicitly depicted again (54 in FIG. 5), in addition to the clocked current sources associated with the block 52. For purposes of simplification, the connection of the control inputs of the current sources to a clocking sequence of equal cycle duration has not been shown. By fabricating this circuit on an integrated circuit by the same semiconductor technology as the original circuit of FIG. 1, it is possible at an appropriately selected circuit layout to achieve a substantially higher clocking rate than with a circuit of the kind shown in FIG. 1. Since elimination of the registers results in the elimination of relatively complex objects of the kind necessitating a significant layout, the requirement for chip surface of the two designs may be comparable in spite of the many additional clocked current sources.

A further substantial advantage of velocity or through-put rate results from the utilization of a clocked circuit in clocked data flow machines.

As regards the through-put rate in clocked data flow machines it is not the time delay of the entire logic block to the next "virtual register" which is decisive, but the clocking rate at which the signals may be applied to the input of the block. The clocking rate may be defined by the clocking rate of the clocked current sources of the individual clocked components of the block in accordance with the invention, so that a successive input signal may be received by the block long before a prior input signal has been processed and before it appears at the output of the block.

The clocked current sources may be formed by transistors operating in a push-pull mode. In that case, a known amplifier circuit of the kind frequently utilized as a voltage amplifier, is used as a controlled high-frequency current source. In the simplest case, this may be an inverter circuit of the kind known from digital circuit technology, the transistor geometries of which must, however, be tuned for use as a clocked current source relative to the transistor geometries of the clocked output stage.

The clocked current sources may also include a single-ended amplifier, as, for instance, where no complementary transistors are available and where a push-pull amplifier may not reasonably be used for such purpose. For purposes of the invention, a suitably dimensioned inductance within or at the load circuit may optionally, at high frequencies, functionally replace the effect of a complementary transistor controlled in a push-pull mode as a controllable current source.

Since each of the clocked current sources need operate only in one defined frequency range (the range of the controlling pulse), it is possible with the inductance in a favorable way to form a resonant circuit tuned to this frequency which may include additional electrical capacitances as well as existing parasitic capacitances.

What is claimed is:

1. A sequential circuit for high-frequency clocking, comprising:

a first block of logic elements interconnected by first signal lines;

a second block of logic elements interconnected by second signal lines and connected to the first block by exterior signal lines;

a plurality of first clocked current sources connected to outputs of the logic elements of the first block;

a plurality of second clocked current sources connected to outputs of the logic elements of the second block;

a clock of the same cycle connected to inputs of the first and second current sources;

wherein the cycle is a whole-number multiple $k \cdot t_0$ of a basic cycle $t_0$ of a clocked current source of a block, $t_0$ being a value identical for all clocked current sources of a given block and k being a positive whole number which may assume different values for each clocked current source of a given block.

2. The sequential circuit of claim 1, wherein the logic elements of at least one block are connected such that each signal path extending between exterior signal lines of the block through logic elements of the block is subject to the same cycle sum, the cycle sum being the sum of cycles, commencing at zero, derived by adding to the cycle sum, along the signal path from the associated input of the block to the associated output of the block, for every clocked current source the output of which is connected to an output of a block of logic elements crossed by the signal path, the cycle of the clock of the current source.

3. The sequential circuit of claim 1, wherein the current sources are provided with a transistorized single-ended amplifier comprising a load inductance and an electrical capacitance, the inductance and capacitance constituting a resonant circuit resonating in the frequency range of the clock.

4. The sequential circuit of claim 3, wherein the capacitance comprises parasitic capacitances.

5. The sequential circuit of claim 3, wherein the capacitance comprises additional electrical capacitances.

6. The sequential circuit of claim 1, wherein the logic elements comprise gates.

7. The sequential circuit of claim 1 wherein the logic elements comprise inverters.

* * * * *